(12) United States Patent
Guo et al.

(10) Patent No.: US 8,232,208 B2
(45) Date of Patent: Jul. 31, 2012

(54) STABILIZED CHEMICAL MECHANICAL POLISHING COMPOSITION AND METHOD OF POLISHING A SUBSTRATE

(75) Inventors: Yi Guo, Newark, DE (US); Zhendong Liu, King of Prussia, PA (US); Kancharla-Arun Kumar Reddy, Bear, DE (US); Guangyun Zhang, Furlong, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 238 days.

(21) Appl. No.: 12/815,564

(22) Filed: Jun. 15, 2010

(65) Prior Publication Data

US 2011/0306211 A1 Dec. 15, 2011

(51) Int. Cl.
*H01L 21/302* (2006.01)
*H01L 21/461* (2006.01)

(52) U.S. Cl. ........ 438/689; 438/690; 438/691; 438/692; 438/693

(58) Field of Classification Search .................. None
See application file for complete search history.

(56) References Cited

U.S. PATENT DOCUMENTS

| | | | |
|---|---|---|---|
| 6,626,968 B2 | 9/2003 | Park et al. | |
| 7,018,560 B2 | 3/2006 | Liu et al. | |
| 2006/0030158 A1* | 2/2006 | Carter et al. | 438/692 |
| 2007/0077865 A1 | 4/2007 | Dysard et al. | |
| 2007/0184661 A1 | 8/2007 | Bian et al. | |
| 2008/0200033 A1* | 8/2008 | Takemiya | 438/693 |
| 2008/0203354 A1 | 8/2008 | Kamimura et al. | |
| 2008/0220610 A1 | 9/2008 | Bayer et al. | |
| 2009/0156008 A1* | 6/2009 | Sakamoto | 438/693 |

OTHER PUBLICATIONS

Copending U.S. Appl. No. 12/887,963.
Copending U.S. Appl. No. 12/432,021.
Copending U.S. Appl. No. 12/885,748.

* cited by examiner

*Primary Examiner* — Duy Deo
(74) *Attorney, Agent, or Firm* — Thomas S. Delbert

(57) ABSTRACT

A chemical mechanical polishing composition, comprising, as initial components: water; 0.1 to 40 wt % abrasive having an average particle size of 5 to 150 nm; 0.001 to 1 wt % of an adamantyl substance according to formula (II); 0 to 1 wt % diquaternary substance according to formula (I); and, 0 to 1 wt % of a quaternary ammonium compound. Also, provided is a method for chemical mechanical polishing using the chemical mechanical polishing composition.

10 Claims, No Drawings

STABILIZED CHEMICAL MECHANICAL POLISHING COMPOSITION AND METHOD OF POLISHING A SUBSTRATE

The present invention relates generally to the field of chemical mechanical polishing. In particular, the present invention is directed to a stabilized chemical mechanical polishing composition and a method for chemical mechanical polishing of semiconductor materials and, more particularly to a method for chemical mechanical polishing of dielectric layers from semiconductor structures in, for example, interlevel dielectric (ILD) and shallow trench isolation (STI) processes.

Modern integrated circuits are manufactured by an elaborate process where electronic circuits composed of semiconductor devices are integrally formed on a small semiconductor structure. The conventional semiconductor devices that are formed on the semiconductor structure include capacitors, resistors, transistors, conductors, diodes, and the like. In advanced manufacturing of integrated circuits, large quantities of these semiconductor devices are formed on a single semiconductor structure.

Additionally, integrated circuits may be arranged as adjoining dies on a common silicon substrate of the semiconductor structure. Typically, surface level scribe regions are located between the dies, where the dies will be cut apart to form discrete integrated circuits. Within the dies, the surface of the semiconductor structure is characterized by raised regions that are caused by the formation of the semiconductor devices. These raised regions form arrays and are separated by lower regions of lesser height on the silicon substrate of the semiconductor structure.

The active devices need to be isolated by dielectrics to prevent cross-talk and signal interference among them. Conventionally, there are two main isolation techniques. One is interlevel dielectric (ILD). The other is called shallow trench isolation (STI).

The ILD structure is mainly used to separate metal wires or plugs in the integrated circuit. The dielectric insulating materials (e.g. silica and silicon nitride) are typically grown or deposited between the gaps and on the top of the metal lines or plugs, which creates non-planar surface characterized by vertically raised protruding features of a greater height extending upward above the arrays and by open troughs of a lower height. A CMP process is then used to reduce the height of the vertically protruding features down to a target height that is typically a predefined distance above the level of the tops of the arrays where, ideally, a planarized surface will be formed.

STI is widely used semiconductor fabrication method for forming isolation structures to electrically isolate the various active components formed in integrated circuits. In the STI technique, the first step is the formation of a plurality of trenches at predefined locations in the substrate, usually by anisotropic etching. Next, silica is deposited into each of these trenches. The silica is then polished by CMP, down to the silicon nitride (stop layer) to form the STI structure. To achieve efficient polishing, the polishing slurry typically provides a high selectivity involving the removal rate of silica relative to silicon nitride ("selectivity").

A conventional CMP slurry for ILD and STI processes comprises a large concentration of abrasives to enhance its effectiveness. Unfortunately, the abrasives are expensive and increased use of the abrasives becomes cost prohibitive.

One polishing composition having a reduced abrasive content for removing silicon oxide is disclosed in U.S. Pat. No. 7,018,560 to Liu et al. Liu et al. discloses an aqueous polishing composition comprising: a corrosion inhibitor for limiting removal of an interconnect metal; an acidic pH; abrasive particles; and an organic containing ammonium salt formed with

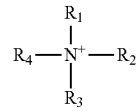

wherein $R_1$, $R_2$, $R_3$ and $R_4$ are radicals, $R_1$ is an unsubstituted aryl, alkyl, aralkyl, or alkaryl group that has a carbon chain length of 2 to 15 carbon atoms and the organic containing ammonium salt has a concentration that accelerates silicon dioxide removal and decreases removal of at least one coating selected from the group consisting of SiC, SiCN, $Si_3N_4$ and SiCO with at least one polishing pressure less than 21.7 kPa.

Notwithstanding, there remains a need for a chemical mechanical polishing composition and method for chemical mechanical polishing of dielectric layers having improved removal rates with a reduced abrasive concentration. In particular, what is needed is a composition and method for polishing of dielectric layers in ILD and STI processes, exhibiting an improved dielectric layer removal rate with a reduced abrasive concentration, as well as an improved storage stability.

The present invention provides a chemical mechanical polishing composition, comprising, as initial components: water; 0.1 to 40 wt % abrasive having an average particle size of 5 to 150 nm; 0.001 to 1 wt % of an adamantyl substance according to formula (II):

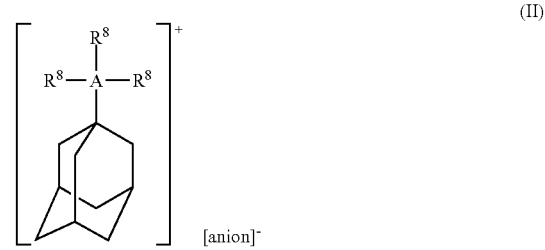

wherein A is selected from N and P; wherein each $R^8$ is independently selected from hydrogen, a saturated or unsaturated $C_{1-15}$ alkyl group, $C_{6-15}$ aryl group, $C_{6-15}$ aralkyl group, $C_{6-15}$ alkaryl group; and, wherein the anion in formula (II) can be any anion that balances the + charge on the cation in formula (II); 0 to 1 wt % diquaternary substance according to formula (I):

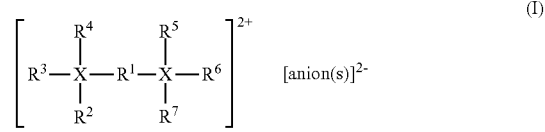

wherein each X is independently selected from N and P; wherein $R^1$ is a saturated or unsaturated $C_1$-$C_{15}$ alkyl group, a $C_6$-$C_{15}$ aryl group and a $C_6$-$C_{15}$ aralkyl group; wherein $R^2$, $R^3$, $R^4$, $R^5$, $R^6$ and $R^7$ are each independently selected from selected from a hydrogen, a saturated or unsaturated $C_1$-$C_{15}$ alkyl group, a $C_6$-$C_{15}$ aryl group, a $C_6$-$C_{15}$ aralkyl group and a $C_6$-$C_{15}$ alkaryl group; and, wherein the anion in formula (I) can be any anion or combination of anions that balance the 2+ charge on the cation in formula (I); and, 0 to 1 wt % of a quaternary ammonium compound selected from tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetratertbutyl ammonium hydroxide, tetrasecbutyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof.

The present invention provides a chemical mechanical polishing composition, comprising, as initial components: water; 0.1 to 40 wt % abrasive having an average particle size of 5 to 150 nm; 0.001 to 1 wt % of an adamantyl substance according to formula (II):

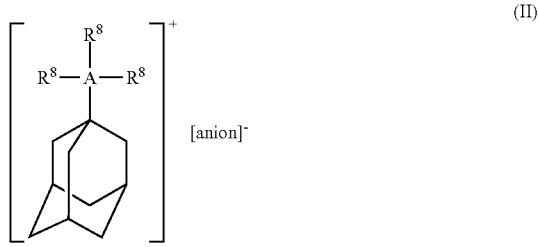

wherein A is selected from N and P; wherein each $R^8$ is independently selected from hydrogen, a saturated or unsaturated $C_{1-15}$ alkyl group, $C_{6-15}$ aryl group, $C_{6-15}$ aralkyl group, $C_{6-15}$ alkaryl group; and, wherein the anion in formula (II) can be any anion that balances the +charge on the cation in formula (II); and at least one of (a) 0.001 to 1 wt % diquaternary substance according to formula (I):

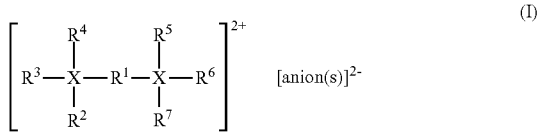

wherein each X is independently selected from N and P; wherein $R^1$ is a saturated or unsaturated $C_1$-$C_{15}$ alkyl group, a $C_6$-$C_{15}$ aryl group and a $C_6$-$C_{15}$ aralkyl group; wherein $R^2$, $R^3$, $R^4$, $R^5$, $R^6$ and $R^7$ are each independently selected from selected from a hydrogen, a saturated or unsaturated $C_1$-$C_{15}$ alkyl group, a $C_6$-$C_{15}$ aryl group, a $C_6$-$C_{15}$ aralkyl group and a $C_6$-$C_{15}$ alkaryl group; and, wherein the anion in formula (I) can be any anion or combination of anions that balance the 2+ charge on the cation in formula (I); and, (b) 0.005 to 1 wt % of a quaternary ammonium compound selected from tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetratertbutyl ammonium hydroxide, tetrasecbutyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof.

The present invention provides a chemical mechanical polishing composition, comprising, as initial components: water; 0.1 to 40 wt % abrasive having an average particle size of 5 to 150 nm; 0.001 to 1 wt % diquaternary substance according to formula (I):

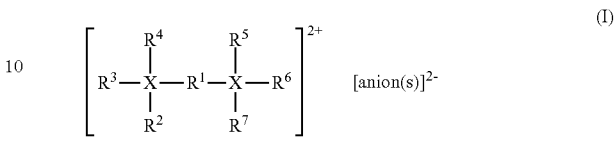

wherein each X is independently selected from N and P; wherein $R^1$ is a saturated or unsaturated $C_1$-$C_{15}$ alkyl group, a $C_6$-$C_{15}$ aryl group and a $C_6$-$C_{15}$ aralkyl group; wherein $R^2$, $R^3$, $R^4$, $R^5$, $R^6$ and $R^7$ are each independently selected from selected from a hydrogen, a saturated or unsaturated $C_1$-$C_{15}$ alkyl group, a $C_6$-$C_{15}$ aryl group, a $C_6$-$C_{15}$ aralkyl group and a $C_6$-$C_{15}$ alkaryl group; and, wherein the anion in formula (I) can be any anion or combination of anions that balance the 2+ charge on the cation in formula (I); and, 0.001 to 1 wt % of an adamantyl substance according to formula (II):

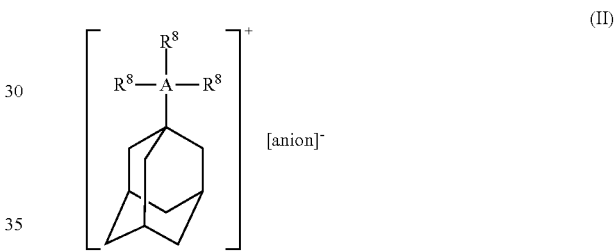

wherein A is selected from N and P; wherein each $R^8$ is independently selected from hydrogen, a saturated or unsaturated $C_{1-15}$ alkyl group, $C_{6-15}$ aryl group, $C_{6-15}$ aralkyl group, $C_{6-15}$ alkaryl group; and, wherein the anion in formula (II) can be any anion that balances the + charge on the cation in formula (II).

The present invention provides a chemical mechanical polishing composition, comprising, as initial components: water; 0.1 to 40 wt % abrasive having an average particle size of 5 to 150 nm; 0.001 to 1 wt % of an adamantyl substance according to formula (II):

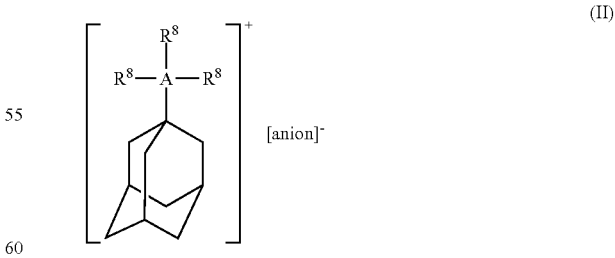

wherein A is selected from N and P; wherein each $R^8$ is independently selected from hydrogen, a saturated or unsaturated $C_{1-15}$ alkyl group, $C_{6-15}$ aryl group, $C_{6-15}$ aralkyl group, $C_{6-15}$ alkaryl group; and, wherein the anion in formula (II) can be any anion that balances the + charge on the cation in formula (II); and 0.005 to 1 wt % of a quaternary ammonium compound selected from tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetratertbutyl ammonium hydroxide, tetrasecbutyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof.

The present invention provides a method for chemical mechanical polishing of a substrate, comprising: providing a substrate, wherein the substrate comprises silicon dioxide; providing a chemical mechanical polishing composition of the present invention; providing a chemical mechanical polishing pad; creating dynamic contact at an interface between the chemical mechanical polishing pad and the substrate with a down force of 0.69 to 34.5 kPa; and dispensing the chemical mechanical polishing composition onto the chemical mechanical polishing pad at or near the interface between the chemical mechanical polishing pad and the substrate; wherein the chemical mechanical polishing composition has a pH of 2 to 6.

The present invention provides a method for chemical mechanical polishing of a substrate, comprising: providing a substrate, wherein the substrate comprises silicon dioxide; providing a chemical mechanical polishing composition of the present invention; providing a chemical mechanical polishing pad; creating dynamic contact at an interface between the chemical mechanical polishing pad and the substrate with a down force of 0.69 to 34.5 kPa; and dispensing the chemical mechanical polishing composition onto the chemical mechanical polishing pad at or near the interface between the chemical mechanical polishing pad and the substrate; wherein the chemical mechanical polishing composition has a pH of 2 to 6; and, wherein the chemical mechanical polishing composition exhibits a silicon dioxide removal rate of at least 1,500 Å/min.

DETAILED DESCRIPTION

The term "minimal effect" used herein and in the appended claims in reference to the change in removal rate of silicon oxide (for removal rate measured in Å/min) resulting from the addition of an adamantyl substance according to formula (II) to the chemical mechanical polishing composition means that the removal rate of silicon oxide changes by $\leq 10\%$. That is, the following expression will be satisfied when the addition of the adamantyl substance according to formula (II) to the chemical mechanical polishing composition has a minimal effect on the silicon oxide removal rate:

(the absolute value of $(A_0-A)/A_0)*100 \leq 10$ wherein A is the silicon oxide removal rate in Å/min for a chemical mechanical polishing composition of the present invention containing, as an initial component, an adamantyl substance according to formula (II), as measured under the polishing conditions set forth in the Examples; and, wherein $A_0$ is the silicon oxide removal rate in Å/min obtained under identical conditions except that the adamantyl substance according to formula (II) is absent from the chemical mechanical polishing composition.

Selection of the specific formulation of the chemical mechanical polishing composition used in the chemical mechanical polishing method of the present invention is key to providing target silicon dioxide removal rates.

Substrate suitable for use in the chemical mechanical polishing method of the present invention for chemical mechanical polishing comprises a semiconductor substrate having silicon dioxide deposited thereon. Optionally, the substrate has silicon dioxide deposited over at least one of SiC, SiCN, $Si_3N_4$, SiCO and polysilicon (most preferably $Si_3N_4$).

Abrasives suitable for use in the chemical mechanical polishing composition of the present invention include, for example, inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Modified forms of these inorganic oxides, such as, organic polymer-coated inorganic oxide particles and inorganic coated particles can also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Preferably, the abrasive is a colloidal silica abrasive.

The abrasive in the chemical mechanical polishing composition of the present invention preferably has an average particle size of 5 to 150 nm; more preferably 20 to 100 nm; still more preferably 20 to 60 nm; most preferably 20 to 50 nm.

The abrasive in the chemical mechanical polishing composition of the present invention preferably contains 0.1 to 40 wt %, more preferably 0.1 to 20 wt %, still more preferably 1 to 20 wt %, most preferably 1 to 10 wt % abrasive.

Preferably, the chemical mechanical polishing composition of the present invention comprises a colloidal silica abrasive having an average particle size of 20 to 60 nm. Still more preferably, the chemical mechanical polishing composition of the present invention comprises 1 to 10 wt % of a colloidal silica abrasive having an average particles size of 20 to 60 nm. Most preferably, the chemical mechanical polishing composition of the present invention comprises 1 to 10 wt % of a colloidal silica abrasive having an average particle size of 20 to 50 nm.

Preferably, the chemical mechanical polishing composition of the present invention comprises 0.001 to 1 wt %, more preferably 0.01 to 0.1 wt %, most preferably 0.01 to 0.05 wt % of an adamantyl substance according to formula (II):

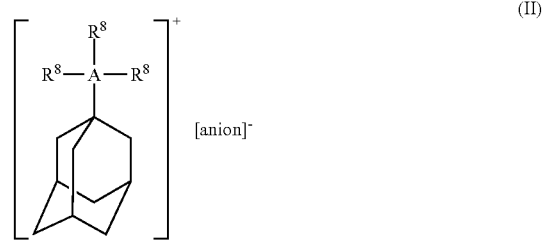

wherein A is selected from N and P (preferably N); wherein each $R^8$ is independently selected from a hydrogen, a saturated or unsaturated $C_1$-$C_{15}$ alkyl group, a $C_6$-$C_{15}$ aryl group, a $C_{6-15}$ aralkyl group and a $C_6$-$C_{15}$ alkaryl group (preferably a hydrogen and a $C_1$-$C_4$ alkyl group; more preferably a hydrogen and a methyl group; most preferably a methyl group);

and, wherein the anion in formula (II) can be any anion that balances the + charge on the cation in formula (II) (preferably the anion in formula (II) is selected from a halogen anion, a hydroxide anion, and a nitrite anion; more preferably a halogen anion and a hydroxide anion; most preferably a hydroxide anion). More preferably, the chemical mechanical polishing composition of the present invention comprises 0.001 to 1 wt %, more preferably 0.01 to 0.1 wt %, most preferably 0.01 to 0.05 wt % of an adamantyl substance, wherein the adamantyl substance is an adamantylammonium substance according to formula (II); wherein A is N; wherein each $R^8$ is independently selected from a hydrogen, a saturated or unsaturated $C_1$-$C_{15}$ alkyl group, a $C_6$-$C_{15}$ aryl group, a $C_{6-15}$ aralkyl group and a $C_6$-$C_{15}$ alkaryl group (preferably a hydrogen and a $C_1$-$C_4$ alkyl group; more preferably a hydrogen and a methyl group; most preferably a methyl group); and, wherein the anion in formula (II) can be any anion that balances the + charge on the cation in formula (II) (preferably the anion in formula (II) is selected from a halogen anion, a hydroxide anion, and a nitrite anion; more preferably a halogen anion and a hydroxide anion; most preferably a hydroxide anion). Most preferably, the chemical mechanical polishing composition of the present invention comprises 0.01 to 0.05 wt % of an adamantylammonium substance having the following formula

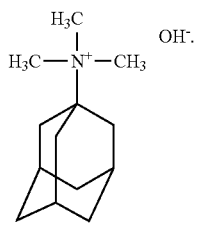

Inclusion of the adamantyl substance according to formula (II) enhances the stability of the chemical mechanical polishing composition of the present invention with minimal effect on the silicon oxide removal rate. Preferably, the silicon oxide removal rate, (A), in Å/min, exhibited by the chemical mechanical polishing composition of the present invention, as measured under the polishing conditions set forth in the Examples, is ≧95% (more preferably ≧98%; most preferably ≧99%) of the silicon oxide removal rate, ($A_0$), obtained under identical conditions except that the adamantyl substance according to formula (II) is absent from the chemical mechanical polishing composition.

The water contained in the chemical mechanical polishing composition of the present invention is preferably at least one of deionized and distilled to limit incidental impurities.

Optionally, the chemical mechanical polishing composition of the present invention comprises, as an initial component: a diquaternary substance according to formula (I):

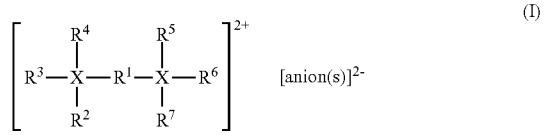

wherein each X is independently selected from N and P, preferably each X is N; wherein $R^1$ is a saturated or unsaturated $C_1$-$C_{15}$ alkyl group, a $C_6$-$C_{15}$ aryl group and a $C_6$-$C_{15}$ aralkyl group (preferably a $C_4$-$C_{10}$ alkyl group; more preferably a $C_2$-$C_6$ alkyl group; most preferably a —$(CH_2)_6$— group); wherein $R^2$, $R^3$, $R^4$, $R^5$, $R^6$ and $R^7$ are each independently selected from selected from a hydrogen, a saturated or unsaturated $C_1$-$C_{15}$ alkyl group, a $C_6$-$C_{15}$ aryl group, a $C_6$-$C_{15}$ aralkyl group and a $C_6$-$C_{15}$ alkaryl group (preferably a hydrogen and a $C_1$-$C_4$ alkyl group; more preferably a hydrogen and a methyl group; most preferably a methyl group); and, wherein the anion in formula (I) can be any anion or combination of anions that balance the 2+ charge on the cation in formula (I) (preferably the anion(s) in formula (I) is(are) selected from halogen anions, hydroxide anions, nitrate anions, sulfate anions and phosphate anions; more preferably halogen anions and hydroxide anions; most preferably hydroxide anions). Preferably, the chemical mechanical polishing composition of the present invention comprises, as an initial component, 0.001 to 1 wt % (more preferably 0.01 to 0.1 wt %, most preferably 0.01 to 0.05 wt %) of a diquaternary substance according to formula (I). Most preferably, the chemical mechanical polishing composition of the present invention comprises 0.01 to 0.05 wt % of a diquaternary substance according to formula (I), wherein each X is N; $R^1$ is a —$(CH_2)_6$— group; and, wherein $R^2$, $R^3$, $R^4$, $R^5$, $R^6$ and $R^7$ are each a —$(CH_2)_3CH_3$ group. Inclusion of the diquaternary substance according to formula (I) accelerates the silicon dioxide removal rate.

Optionally, the chemical mechanical polishing composition of the present invention comprises, as an initial component, 0 to 1 wt % (preferably 0.005 to 1 wt %, more preferably 0.005 to 0.75 wt %; most preferably 0.005 to 0.05 wt %) of a quaternary ammonium compound selected from tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetratertbutyl ammonium hydroxide, tetrasecbutyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof (most preferably, selected from tetraethyl ammonium hydroxide (TEAR), tetramethyl ammonium hydroxide (TMAH) and tetrabutylammonium hydroxide (TBAH)).

The chemical mechanical polishing composition of the present invention optionally further comprises additional additives selected from dispersants, surfactants, buffers and biocides.

The chemical mechanical polishing composition of the present invention optionally is corrosion inhibitor agent free. The term "corrosion inhibitor agent free" as used herein and in the appended claims means that the chemical mechanical polishing composition does not contain benzotriazole; 1,2,3-benzotriazole; 5,6-dimethyl-1,2,3-benzotriazole; 1-(1,2-dicarboxyethyl)benzotriazole; 1-[N,N-bis(hydroxylethyl)aminomethyl]benzotrizole; or 1-(hydroxylmethyl)benzotriazole.

The chemical mechanical polishing composition of the present invention is oxidizer free. The term "oxidizer free" as used herein and in the appended claims means that the chemical mechanical polishing composition does not contain oxidizers such as hydrogen peroxide, persulfate salts (e.g., ammonium monopersulfate, and potassium dipersulfate) and periodate salts (e.g., potassium periodate).

The chemical mechanical polishing composition of the present invention provides efficacy over a pH of 2 to 6. Preferably, the chemical mechanical polishing composition used provides efficacy over a pH of 2 to 5. Most preferably, the chemical mechanical polishing composition used provides efficacy over a pH of 2 to 4. Acids suitable for use adjusting the pH of the chemical mechanical polishing composition include, for example, phosphoric acid, nitric acid, sulfuric acid and hydrochloric acid. Bases suitable for use adjusting the pH of the chemical mechanical polishing composition include, for example, ammonium hydroxide and potassium hydroxide.

Preferably, the chemical mechanical polishing composition of the present invention exhibits a silicon dioxide removal rate $\geq$1,500 Å/min; more preferably $\geq$1,800 Å/min; most preferably $\geq$2,000 Å/min.

Preferably, the chemical mechanical polishing composition of the present invention comprises, as initial components: water; 0.1 to 40 wt % (preferably 0.1 to 20 wt %, still more preferably 1 to 20 wt %, most preferably 1 to 10 wt %) abrasive having an average particle size of 5 to 150 nm (preferably 20 to 100 nm, more preferably 20 to 60 nm, most preferably 20 to 50 nm); 0.001 to 1 wt % (preferably 0.01 to 0.1 wt %, more preferably 0.02 to 0.06 wt %) diquaternary substance according to formula (I):

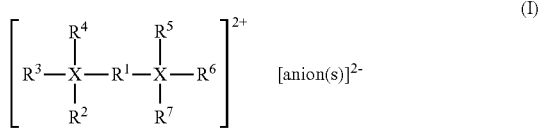

wherein each X is independently selected from N and P, preferably each X is N; wherein $R^1$ is a saturated or unsaturated $C_1$-$C_{15}$ alkyl group, a $C_6$-$C_{15}$ aryl group and a $C_6$-$C_{15}$ aralkyl group (preferably a $C_4$-$C_{10}$ alkyl group; more preferably a $C_2$-$C_6$ alkyl group; most preferably a —$(CH_2)_6$— group); wherein $R^2$, $R^3$, $R^4$, $R^5$, $R^6$ and $R^7$ are each independently selected from selected from a hydrogen, a saturated or unsaturated $C_1$-$C_{15}$ alkyl group, a $C_6$-$C_{15}$ aryl group, a $C_6$-$C_{15}$ aralkyl group and a $C_6$-$C_{15}$ alkaryl group (preferably a hydrogen and a $C_1$-$C_4$ alkyl group; more preferably a hydrogen and a methyl group; most preferably a methyl group); and, wherein the anion in formula (I) can be any anion or combination of anions that balance the 2+ charge on the cation in formula (I) (preferably the anion(s) in formula (I) is(are) selected from halogen anions, hydroxide anions, nitrate anions, sulfate anions and phosphate anions; more preferably halogen anions and hydroxide anions; most preferably hydroxide anions); 0.001 to 1 wt % (preferably 0.01 to 0.1 wt %; most preferably 0.01 to 0.05 wt %) of an adamantyl substance according to formula (II):

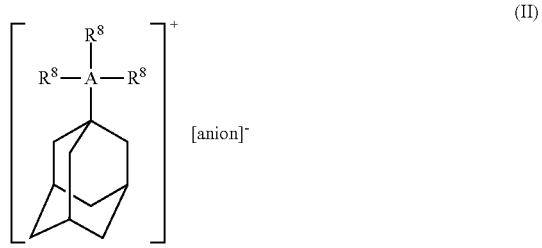

wherein A is selected from N and P (preferably N); wherein each $R^8$ is independently selected from a hydrogen, a saturated or unsaturated $C_1$-$C_{15}$ alkyl group, a $C_6$-$C_{15}$ aryl group, a $C_{6\text{-}15}$ aralkyl group and a $C_6$-$C_{15}$ alkaryl group (preferably a hydrogen and a $C_1$-$C_4$ alkyl group; more preferably a hydrogen and a methyl group; most preferably a methyl group); and, wherein the anion in formula (II) can be any anion that balances the + charge on the cation in formula (II) (preferably the anion in formula (II) is selected from a halogen anion, a hydroxide anion, and a nitrite anion; more preferably a halogen anion and a hydroxide anion; most preferably a hydroxide anion); and, 0 to 1 wt % (preferably 0.005 to 1 wt %; more preferably 0.005 to 0.075 wt %, most preferably 0.005 to 0.05 wt %) of a quaternary alkylammonium compound; wherein the chemical mechanical polishing composition exhibits a silicon dioxide removal rate of $\geq$1,500 Å/min; preferably 1,800 Å/min; more preferably $\geq$2,000 Å/min.

The chemical mechanical polishing composition of the present invention preferably has storage stability. The term "storage stability" as used herein and in the appended claims means that the viscosity of the subject chemical mechanical polishing composition increases less than 5% following storage at 55° C. for one week, wherein the viscosity is measured using a Brookfield DV-I+ Viscometer at 20° C. using a Brookfield #S00 spindle set at 100 rpm. More preferably, the chemical mechanical polishing composition of the present invention has extended storage stability. The term "extended storage stability" as used herein and in the appended claims means that the viscosity of the subject chemical mechanical polishing composition increases less than 15% following storage at 55° C. for four weeks, wherein the viscosity is measured using a Brookfield DV-I+ Viscometer at 20° C. using a Brookfield #S00 spindle set at 100 rpm.

The chemical mechanical polishing method of the present invention comprises: providing a substrate, wherein the substrate comprises silicon dioxide (optionally silicon dioxide and at least one of SiC, SiCN, $Si_3N_4$, SiCO and polysilicon; preferably silicon dioxide deposited on silicon nitride); providing a chemical mechanical polishing composition of the present invention, wherein the chemical mechanical polishing composition comprises, as initial components: water, 0.1 to 40 wt % (preferably 0.1 to 20 wt %, most preferably 1 to 10 wt %) abrasive having an average particle size of 5 to 150 nm (preferably 20 to 60 nm, most preferably 20 to 50 nm); 0 to 1 wt % (preferably 0.01 to 1 wt %; more preferably 0.01 to 0.1 wt %, most preferably 0.01 to 0.05 wt %) diquaternary substance according to formula (I):

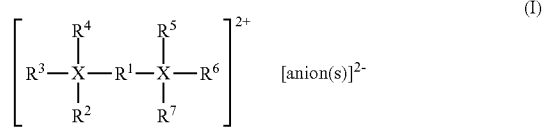

wherein each X is independently selected from N and P, preferably each X is N; wherein $R^1$ is a saturated or unsaturated $C_1$-$C_{15}$ alkyl group, a $C_6$-$C_{15}$ aryl group and a $C_6$-$C_{15}$ aralkyl group (preferably a $C_4$-$C_{10}$ alkyl group; more preferably a $C_2$-$C_6$ alkyl group; most preferably a —$(CH_2)_6$— group); wherein $R^2$, $R^3$, $R^4$, $R^5$, $R^6$ and $R^7$ are each independently selected from selected from a hydrogen, a saturated or unsaturated $C_1$-$C_{15}$ alkyl group, a $C_6$-$C_{15}$ aryl group, a $C_6$-$C_{15}$ aralkyl group and a $C_6$-$C_{15}$ alkaryl group (preferably a hydrogen and a $C_1$-$C_4$ alkyl group; more preferably a hydrogen and a methyl group; most preferably a methyl group); and, wherein the anion in formula (I) can be any anion or combination of anions that balance the 2+ charge on the cation in formula (I) (preferably the anion(s) in formula (I) is(are) selected from halogen anions, hydroxide anions, nitrate anions, sulfate anions and phosphate anions; more preferably halogen anions and hydroxide anions; most preferably hydroxide anions); 0.001 to 1 wt % (preferably 0.01 to 0.1 wt %; most preferably 0.01 to 0.05 wt %) of an adamantyl substance according to formula (II):

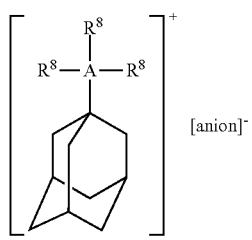

wherein A is selected from N and P (preferably N); wherein each $R^8$ is independently selected from a hydrogen, a saturated or unsaturated $C_1$-$C_{15}$ alkyl group, a $C_6$-$C_{15}$ aryl group, a $C_{6-15}$ aralkyl group and a $C_6$-$C_{15}$ alkaryl group (preferably a hydrogen and a $C_1$-$C_4$ alkyl group; more preferably a hydrogen and a methyl group; most preferably a methyl group); and, wherein the anion in formula (II) can be any anion that balances the + charge on the cation in formula (II) (preferably the anion in formula (II) is selected from a halogen anion, a hydroxide anion, and a nitrite anion; more preferably a halogen anion and a hydroxide anion; most preferably a hydroxide anion); and 0 to 1 wt % (preferably 0.005 to 1 wt %; more preferably 0.005 to 0.075 wt %, most preferably 0.005 to 0.05 wt %) of a quaternary alkylammonium compound; providing a chemical mechanical polishing pad; creating dynamic contact at an interface between the chemical mechanical polishing pad and the substrate with a down force of 0.69 to 34.5 kPa (0.1 to 5 psi), preferably 0.69 to 20.7 kPa (0.1 to 3 psi); and dispensing the chemical mechanical polishing composition onto the chemical mechanical polishing pad at or near the interface between the chemical mechanical polishing pad and the substrate; wherein the chemical mechanical polishing composition has a pH of 2 to 6, preferably 2 to 5, most preferably 2 to 4; wherein the silicon dioxide and silicon nitride are exposed to the chemical mechanical polishing composition; and, wherein the chemical mechanical polishing composition exhibits a silicon dioxide removal rate of $\geq$1,500 Å/min, preferably 1,800 Å/min, more preferably $\geq$2,000 Å/min. Preferably, the chemical mechanical polishing composition used further exhibits a silicon dioxide to silicon nitride selectivity of $\geq$5:1, more preferably $\geq$6:1. Preferably, the abrasive used in the chemical mechanical polishing composition is colloidal silica and the chemical mechanical polishing composition used exhibits a silicon dioxide removal rate of at least 1,500 Å/min, more preferably at least 1,800 Å/min, most preferably at least 2,000 Å/min with a platen speed of 93 revolutions per minute, a carrier speed of 87 revolutions per minute, a chemical mechanical polishing composition flow rate of 200 ml/min, and a nominal down force of 20.7 kPa (3 psi) on a 200 mm polishing machine (e.g., a Applied Materials Mirra® polisher) where the chemical mechanical polishing pad comprises a polyurethane polishing layer containing polymeric hollow core microparticles and a polyurethane impregnated non-woven subpad (e.g., an IC1010 polishing pad available from Rohm and Haas Electronic Materials CMP Inc.).

Preferably, the chemical mechanical polishing method of the present invention comprises: providing a substrate, wherein the substrate comprises silicon dioxide and silicon nitride, preferably silicon dioxide deposited on silicon nitride; providing a chemical mechanical polishing composition, comprising, as initial components: water; 1 to 10 wt % colloidal silica abrasive having an average particle size of 20 to 60 nm; 0.01 to 0.05 wt % diquaternary substance according to formula (I):

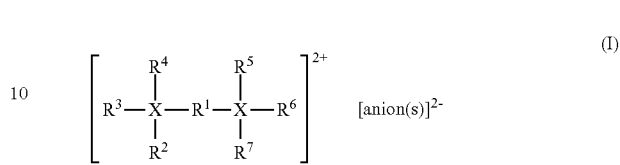

wherein each X is a N; wherein $R^1$ is selected from $C_4$-$C_{10}$ alkyl group; wherein $R^2$, $R^3$, $R^4$, $R^5$, $R^6$ and $R^7$ are individually selected from $C_2$-$C_6$ alkyl group; and, wherein the anion in formula (I) can be any anion or combination of anions that balance the 2+ charge on the cation in formula (I) (preferably the anion(s) in formula (I) is(are) selected from halogen anions, hydroxide anions, nitrate anions, sulfate anions and phosphate anions; more preferably halogen anions and hydroxide anions; most preferably hydroxide anions); 0.01 to 0.05 wt % of an adamantyl substance according to formula (II):

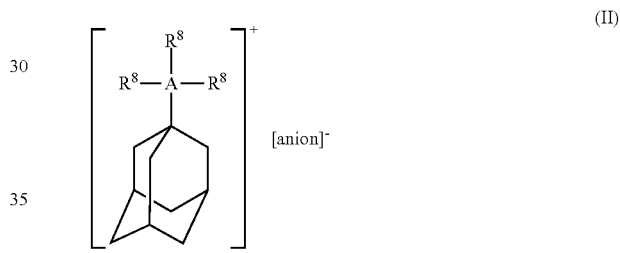

wherein A is N; wherein each $R^8$ is independently selected from a hydrogen and a $C_1$-$C_4$ alkyl group; and, wherein the anion in formula (II) can be any anion that balances the + charge on the cation in formula (II) (preferably the anion in formula (II) is selected from a halogen anion, a hydroxide anion, and a nitrite anion; more preferably a halogen anion and a hydroxide anion; most preferably a hydroxide anion); and 0 to 1 wt % (preferably 0.005 to 1 wt %; more preferably 0.005 to 0.075 wt %, most preferably 0.005 to 0.05 wt %) of a quaternary alkylammonium compound; providing a chemical mechanical polishing pad; creating dynamic contact at an interface between the chemical mechanical polishing pad and the substrate with a down force of 0.69 to 34.5 kPa (0.1 to 5 psi), preferably 0.69 to 20.7 kPa (0.1 to 3 psi); and dispensing the chemical mechanical polishing composition onto the chemical mechanical polishing pad at or near the interface between the chemical mechanical polishing pad and the substrate; wherein the chemical mechanical polishing composition has a pH of 2 to 6, preferably 2 to 5, most preferably 2 to 4; wherein the silicon dioxide and silicon nitride are exposed to the chemical mechanical polishing composition; and, wherein the chemical mechanical polishing composition exhibits storage stability (preferably extended storage stability). Preferably, the abrasive used in the chemical mechanical polishing composition used in the chemical mechanical polishing method of the present invention is colloidal silica and the chemical mechanical polishing composition used exhibits a silicon dioxide removal rate of at least 1,500 Å/min, more preferably at least 1,800 Å/min, most preferably 2,000 Å/min with a platen speed of 93 revolutions per minute, a carrier speed of 87 revolutions per minute, a chemical mechanical polishing composition flow rate of 200 ml/min, and a nominal down force of 20.7 kPa (3 psi) on a 200 mm polishing machine (e.g., an Applied Materials Mirra® polisher) where the chemical mechanical polishing pad comprises a polyurethane polishing layer containing polymeric hollow core microparticles and a polyurethane impregnated non-woven subpad (e.g., an IC1010 polishing pad available from Rohm and Haas Electronic Materials CMP Inc.)

Preferably, the chemical mechanical polishing method of the present invention comprises: providing a substrate, wherein the substrate comprises silicon dioxide and silicon nitride, preferably silicon dioxide deposited on silicon nitride; providing a chemical mechanical polishing composition, wherein the chemical mechanical polishing composition comprises, as initial components: water; 1 to 10 wt % colloidal silica abrasive having an average particle size of 20 to 60 nm; 0.01 to 0.05 wt % diquaternary substance according to formula (I):

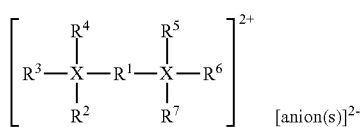

wherein each X is N; wherein $R^1$ is a —$(CH_2)_6$— group; wherein $R^2$, $R^3$, $R^4$, $R^5$, $R^6$ and $R^7$ are each a —$(CH_2)_3CH_3$ group; and wherein the anion(s) of formula (I) are two hydroxide anions; 0.01 to 0.05 wt % of an adamantyl substance according to formula (II), wherein the adamantyl substance is N,N,N-trimethyl-1-adamantylammonium hydroxide; and, 0 to 0.05 wt % quaternary alkylammonium compound selected from tetraethyl ammonium hydroxide and tetrabutyl ammonium hydroxide; providing a chemical mechanical polishing pad; creating dynamic contact at an interface between the chemical mechanical polishing pad and the substrate with a down force of 0.69 to 20.7 kPa (0.1 to 3 psi); and dispensing the chemical mechanical polishing composition onto the chemical mechanical polishing pad at or near the interface between the chemical mechanical polishing pad and the substrate; wherein the chemical mechanical polishing composition has a pH of 2 to 4; wherein the silicon dioxide and silicon nitride are exposed to the chemical mechanical polishing composition; and, wherein the chemical mechanical polishing composition exhibits storage stability (preferably extended storage stability). Preferably, the abrasive used in the chemical mechanical polishing composition used in the chemical mechanical polishing method of the present invention is colloidal silica and the chemical mechanical polishing composition used exhibits a silicon dioxide removal rate of at least 1,500 Å/min, more preferably at least 1,800 Å/min, most preferably at least 2,000 Å/min with a platen speed of 93 revolutions per minute, a carrier speed of 87 revolutions per minute, a chemical mechanical polishing composition flow rate of 200 ml/min, and a nominal down force of 20.7 kPa (3 psi) on a 200 mm polishing machine (e.g., an Applied Materials Mirra® polisher) where the chemical mechanical polishing pad comprises a polyurethane polishing layer containing polymeric hollow core microparticles and a polyurethane impregnated non-woven subpad (e.g., an IC1010 polishing pad available from Rohm and Haas Electronic Materials CMP Inc.).

Some embodiments of the present invention will now be described in detail in the following Examples.

COMPARATIVE EXAMPLE C1 AND EXAMPLES A1-A2

Chemical Mechanical Polishing Composition Preparation

The chemical mechanical polishing compositions used in the Comparative Polishing Example PC1 and Polishing Examples PA1-PA2 (namely chemical mechanical polishing compositions C1 and A1-A2, respectively) were prepared by combining the components in the amounts listed in Table 1 and adjusting the pH of the compositions to the final pH listed in Table 1 with phosphoric acid or nitric acid as noted.

TABLE 1

| Ex # | Abrasive I* (wt %) | Abrasive II£ (wt %) | HBHMAH∈ (wt %) | TMAAℏ (wt %) | pH¥ |
|------|------|------|------|------|------|
| C1 | 1 | 5 | 0.03 | 0 | 3 |
| A1 | 1 | 5 | 0.03 | 0.01 | 3 |
| A2 | 1 | 5 | 0.03 | 0.03 | 3 |

*Abrasive I—Klebosol ™ 30H50i slurry manufactured by AZ Electronic Materials, available from The Dow Chemical Company.
£Abrasive II—Klebosol ™ PL1598-B25 slurry manufactured by AZ Electronic Materials, available from The Dow Chemical Company.
∈HBHMAH: hexabutylhexamethylenediammonium dihydroxide from Sigma-Aldrich Co. (Purum grade):

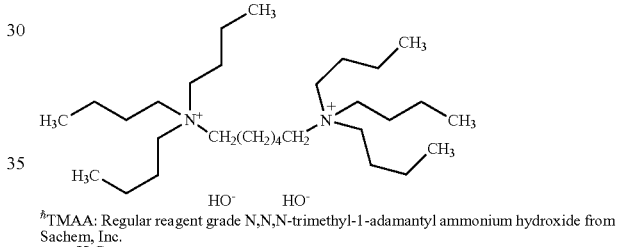

ℏTMAA: Regular reagent grade N,N,N-trimethyl-1-adamantyl ammonium hydroxide from Sachem, Inc.

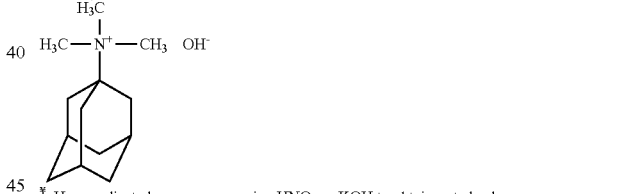

¥pH was adjusted as necessary using HNO₃ or KOH to obtain noted value.

COMPARATIVE EXAMPLE PC1 AND EXAMPLES PA1-PA2

Chemical Mechanical Polishing Experiments

Silicon dioxide removal rate polishing tests were performed using the chemical mechanical polishing compositions prepared according to Comparative Example C1 and Examples A1-A2. Specifically, the silicon dioxide removal rate for each of the chemical mechanical polishing compositions C1 and A1-A2 identified in Table 1. These silicon dioxide removal rate experiments were performed on eight inch blanket wafers having a silicon dioxide film on a silicon substrate using a Applied Materials Mirra® polisher and an IC1010™ polyurethane polishing pad (commercially available from Rohm and Haas Electronic Materials CMP Inc.) with a down force of 20.7 kPa (3 psi), a chemical mechanical polishing composition flow rate of 200 ml/min, a table rotation speed of 93 rpm and a carrier rotation speed of 87 rpm. The silicon dioxide removal rates were determined by measuring the film thickness before and after polishing using a KLA-Tencor FX200 metrology tool. The results of the silicon dioxide removal rate experiments are provided in Table 2.

TABLE 2

| Polish Example # | Polishing Composition | SiO$_2$ removal rate (Å/min) |
|---|---|---|
| PC1 | C1 | 2488 |
| PA1 | A1 | 2475 |
| PA2 | A2 | 2471 |

Accelerated Stability Testing

The polishing compositions prepared according to Comparative Example C1 and Examples A1-A2 were subjected to an accelerated aging experiment to gage the stability of those compositions. Specifically, the polishing compositions were placed in an oven set at 55° C. for a period of four (4) weeks. The viscosity of each polishing composition was measured weekly using a Brookfield DV-I+ Viscometer at 20° C. using a Brookfield #S00 spindle set at 100 rpm. The results are provided in Table 3. The data demonstrate that the polishing compositions of the present invention exhibit significantly enhanced stability.

TABLE 3

| Polishing Composition | Viscosity (cP) | | | | |
|---|---|---|---|---|---|
| | Initial | Week 1 | Week 2 | Week 3 | Week 4 |
| C1 | 1.3 | 2.3 | 3.5$^P$ | gelled | gelled |
| A1 | 1.2 | 1.2 | — | 1.4 | 1.6 |
| A2 | 1.2 | 1.2 | — | 1.3 | 1.3 |

$^P$Precipitate formed

We claim:

1. A chemical mechanical polishing composition, comprising, as initial components:
   water;
   0.1 to 40 wt % abrasive having an average particle size of 5 to 150 nm;
   0.001 to 1 wt % of an adamantyl substance according to formula (II):

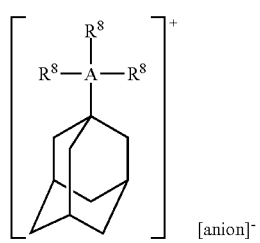

(II)

wherein A is selected from N and P; wherein each R$^8$ is independently selected from hydrogen, a saturated or unsaturated C$_{1-15}$ alkyl group, C$_{6-15}$ aryl group, C$_{6-15}$ aralkyl group, C$_{6-15}$ alkaryl group; and, wherein the anion in formula (II) can be any anion that balances the + charge on the cation in formula (II);
   0 to 1 wt % diquaternary substance according to formula (I):

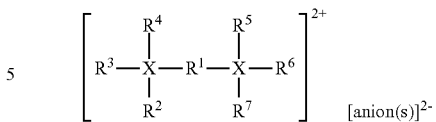

(I)

wherein each X is independently selected from N and P; wherein R$^1$ is a saturated or unsaturated C$_1$-C$_{15}$ alkyl group, a C$_6$-C$_{15}$ aryl group and a C$_6$-C$_{15}$ aralkyl group; wherein R$^2$, R$^3$, R$^4$, R$^5$, R$^6$ and R$^7$ are each independently selected from selected from a hydrogen, a saturated or unsaturated C$_1$-C$_{15}$ alkyl group, a C$_6$-C$_{15}$ aryl group, a C$_6$-C$_{15}$ aralkyl group and a C$_6$-C$_{15}$ alkaryl group; and, wherein the anion in formula (I) can be any anion or combination of anions that balance the 2+ charge on the cation in formula (I); and,
   0 to 1 wt % of a quaternary ammonium compound selected from tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetratert-butyl ammonium hydroxide, tetrasecbutyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof.

2. The chemical mechanical polishing composition of claim 1, wherein the chemical mechanical polishing composition comprises, as an initial component, at least one of:
   (a) 0.001 to 1 wt % diquaternary substance according to formula (I); and,
   (b) 0.005 to 1 wt % of the quaternary ammonium compound.

3. The chemical mechanical polishing composition of claim 1, wherein the chemical mechanical polishing composition comprises, as an initial component: 0.001 to 1 wt % diquaternary substance according to formula (I).

4. The chemical mechanical polishing composition of claim 3, wherein each X is N; R$^1$ is a —(CH$_2$)$_6$— group; and, wherein R$^2$, R$^3$, R$^4$, R$^5$, R$^6$ and R$^7$ are each a —(CH$_2$)$_3$CH$_3$ group.

5. The chemical mechanical polishing composition of claim 1, wherein A is N and wherein each R$^8$ is a —CH$_3$ group.

6. The chemical mechanical polishing composition of claim 3, wherein A is N and wherein each R$^8$ is a —CH$_3$ group.

7. A method for chemical mechanical polishing of a substrate, comprising:
   providing a substrate, wherein the substrate comprises silicon dioxide;
   providing a chemical mechanical polishing composition according to claim 1;
   providing a chemical mechanical polishing pad;
   creating dynamic contact at an interface between the chemical mechanical polishing pad and the substrate with a down force of 0.69 to 34.5 kPa; and
   dispensing the chemical mechanical polishing composition onto the chemical mechanical polishing pad at or near the interface between the chemical mechanical polishing pad and the substrate;
   wherein the chemical mechanical polishing composition has a pH of 2 to 6.

8. The method of claim 7, wherein the chemical mechanical polishing composition contains, as initial components: 1 to 10 wt % colloidal silica abrasive having an average particle size of 20 to 60 nm; 0.01 to 0.05 wt % diquaternary substance according to formula (I) and 0.01 to 0.05 wt % adamantyl substance according to formula (II); wherein each X is N; $R^1$ is a —$(CH_2)_6$— group; wherein $R^2$, $R^3$, $R^4$, $R^5$, $R^6$ and $R^7$ are each a —$(CH_2)_3CH_3$ group; wherein the cation(s) of formula (I) are two hydroxide anions; wherein A is N; wherein each $R^8$ is a —$CH_3$ group; wherein the anion in formula (II) is a hydroxide anion.

9. The method of claim 8, wherein the abrasive is a colloidal silica; and wherein the chemical mechanical polishing composition exhibits a silicon dioxide removal rate of at least 1,500 Å/min with a platen speed of 93 revolutions per minute, a carrier speed of 87 revolutions per minute, a chemical mechanical polishing composition flow rate of 200 ml/min, and a nominal down force of 20.7 kPa on a 200 mm polishing machine where the chemical mechanical polishing pad comprises a polyurethane polishing layer containing polymeric hollow core microparticles and a polyurethane impregnated non-woven subpad.

10. The method of claim 7, wherein the substrate further comprises at least one of SiC, SiCN, $Si_3N_4$, SiCO and polysilicon.

* * * * *